United States Patent
Trauernicht et al.

(10) Patent No.: US 9,282,647 B2
(45) Date of Patent: Mar. 8, 2016

(54) METHOD OF MAKING MICRO-CHANNEL STRUCTURE FOR MICRO-WIRES

(71) Applicants: David Paul Trauernicht, Rochester, NY (US); John Andrew Lebens, Rush, NY (US); Yongcai Wang, Rochester, NY (US)

(72) Inventors: David Paul Trauernicht, Rochester, NY (US); John Andrew Lebens, Rush, NY (US); Yongcai Wang, Rochester, NY (US)

(73) Assignee: EASTMAN KODAK COMPANY, Rochester, NY (US)

( * ) Notice: Subject to any disclaimer, the term of this patent is extended or adjusted under 35 U.S.C. 154(b) by 399 days.

(21) Appl. No.: 13/746,346

(22) Filed: Jan. 22, 2013

(65) Prior Publication Data
US 2014/0205810 A1     Jul. 24, 2014

(51) Int. Cl.
| | |
|---|---|
| *H05K 3/12* | (2006.01) |
| *B05D 5/12* | (2006.01) |
| *B05D 3/10* | (2006.01) |
| *H01Q 1/38* | (2006.01) |
| *G06F 3/041* | (2006.01) |
| *H05K 1/02* | (2006.01) |
| *H05K 1/09* | (2006.01) |
| *H05K 1/16* | (2006.01) |
| *H05K 3/00* | (2006.01) |

(52) U.S. Cl.
CPC ............. *H05K 3/1258* (2013.01); *B05D 3/108* (2013.01); *B05D 5/12* (2013.01); *G06F 3/041* (2013.01); *H01Q 1/38* (2013.01); *H05K 3/1283* (2013.01); *H05K 1/0287* (2013.01); *H05K 1/097* (2013.01); *H05K 1/16* (2013.01); *H05K 3/0044* (2013.01); *H05K 2201/0108* (2013.01); *H05K 2203/0108* (2013.01); *Y10T 428/24612* (2015.01)

(58) Field of Classification Search
None
See application file for complete search history.

(56) References Cited

U.S. PATENT DOCUMENTS

| | | | |
|---|---|---|---|
| 6,645,444 B2 | 11/2003 | Goldstein | |
| 8,179,381 B2 | 5/2012 | Frey et al. | |
| 2002/0145144 A1* | 10/2002 | Kane | ............... G02F 1/1368 257/72 |
| 2006/0057502 A1 | 3/2006 | Okada et al. | |
| 2007/0012950 A1* | 1/2007 | Cain et al. | ........................ 257/194 |
| 2007/0013049 A1* | 1/2007 | Asai et al. | ........................ 257/700 |
| 2008/0054331 A1* | 3/2008 | Chen et al. | ........................ 257/315 |
| 2010/0026664 A1 | 2/2010 | Geaghan | |
| 2010/0237463 A1* | 9/2010 | Kang | ................. G06F 17/5068 257/532 |
| 2010/0328248 A1 | 12/2010 | Mozdzyn | |
| 2011/0007011 A1 | 1/2011 | Mozdzyn | |
| 2011/0204334 A1* | 8/2011 | Kim et al. | ........................ 257/40 |
| 2011/0279189 A1* | 11/2011 | Umeda | ........................ 333/5 |
| 2011/0303885 A1* | 12/2011 | Vanheusden et al. | ......... 252/513 |

FOREIGN PATENT DOCUMENTS

CN    102063951    5/2011

* cited by examiner

*Primary Examiner* — Shamim Ahmed
*Assistant Examiner* — Bradford Gates
(74) *Attorney, Agent, or Firm* — Raymond L. Owens; Kevin E. Spaulding (57) ABSTRACT

A method of making a micro-channel structure and applying a curable ink to the micro-channel structure includes providing a substrate and depositing a single layer of a curable polymer on the substrate, the single curable layer having a layer thickness. One or more micro-channels adapted to receive curable ink are embossed into the single curable layer, the micro-channels having a micro-channel thickness that is in a range of two microns to ten microns less than the layer thickness. The single curable layer is cured to form a single cured layer so that deformations of the micro-channels or the surface of the single cured layer are reduced. Curable ink is coated over the surface and micro-channels of the single cured layer. The curable ink is removed from the surface of the single cured layer and the curable ink is cured.

18 Claims, 7 Drawing Sheets

METHOD OF MAKING MICRO-CHANNEL STRUCTURE FOR MICRO-WIRES

CROSS REFERENCE TO RELATED APPLICATIONS

Reference is made to commonly-assigned, co-pending U.S. patent application Ser. No. 13/746,352 filed Jan. 22, 2013 herewith, entitled "Micro-Channel Structure for Micro-Wires" by David Paul Trauernicht, et al., the disclosure of which is incorporated herein.

Reference is made to commonly-assigned U.S. patent application Ser. No. 13/406,665 filed Feb. 28, 2012 entitled "Making Micro-Wires with Different Heights" to Ronald S. Cok., et al, the disclosure of which is incorporated herein.

FIELD OF THE INVENTION

The present invention relates to transparent electrodes having micro-wires formed in micro-channels and in particular to the micro-channel structure.

BACKGROUND OF THE INVENTION

Transparent conductors are widely used in the flat-panel display industry to form electrodes that are used to electrically switch light-emitting or light-transmitting properties of a display pixel, for example in liquid crystal or organic light-emitting diode displays. Transparent conductive electrodes are also used in touch screens in conjunction with displays. In such applications, the transparency and conductivity of the transparent electrodes are important attributes. In general, it is desired that transparent conductors have a high transparency (for example, greater than 90% in the visible spectrum) and a low electrical resistivity (for example, less than 10 ohms/square).

Transparent conductive metal oxides are well known in the display and touch-screen industries and have a number of disadvantages, including limited transparency and conductivity and a tendency to crack under mechanical or environmental stress. Typical prior-art conductive electrode materials include conductive metal oxides such as indium tin oxide (ITO) or very thin layers of metal, for example silver or aluminum or metal alloys including silver or aluminum. These materials are coated, for example, by sputtering or vapor deposition, and are patterned on display or touch-screen substrates, such as glass.

Transparent conductive metal oxides are increasingly expensive and relatively costly to deposit and pattern. Moreover, the substrate materials are limited by the electrode material deposition process (e.g. sputtering) and the current-carrying capacity of such electrodes is limited, thereby limiting the amount of power that can be supplied to the pixel elements. Although thicker layers of metal oxides or metals increase conductivity, they also reduce the transparency of the electrodes.

Transparent electrodes, including very fine patterns of conductive elements, such as metal wires or conductive traces are known. For example, U.S. Patent Publication No. 2011/0007011 teaches a capacitive touch screen with a mesh electrode, as does U.S. Patent Publication No. 2010/0026664.

It is known in the prior art to form conductive traces including nano-particles, for example silver nano-particles. The synthesis of such metallic nano-crystals is known. Issued U.S. Pat. No. 6,645,444 entitled "Metal nano-crystals and synthesis thereof" describes a process for forming metal nano-crystals optionally doped or alloyed with other metals. U.S. Patent Application Publication No. 2006/0057502 entitled "Method of forming a conductive wiring pattern by laser irradiation and a conductive wiring pattern" describes fine wirings made by drying a coated metal dispersion colloid into a metal-suspension film on a substrate, pattern-wise irradiating the metal-suspension film with a laser beam to aggregate metal nano-particles into larger conductive grains, removing non-irradiated metal nano-particles, and forming metallic wiring patterns from the conductive grains.

More recently, transparent electrodes including very fine patterns of conductive micro-wires have been proposed. For example, capacitive touch-screens with mesh electrodes including very fine patterns of conductive elements, such as metal wires or conductive traces, are taught in U.S. Patent Application Publication No. 2010/0328248 and U.S. Pat. No. 8,179,381, which are hereby incorporated in their entirety by reference. As disclosed in U.S. Pat. No. 8,179,381, fine conductor patterns are made by one of several processes, including laser-cured masking, inkjet printing, gravure printing, micro-replication, and micro-contact printing. In particular, micro-replication is used to form micro-conductors formed in micro-replicated channels. The transparent micro-wire electrodes include micro-wires between $0.5\mu$ and $4\mu$ wide and a transparency of between approximately 86% and 96%.

Conductive micro-wires can be formed in micro-channels embossed in a substrate, for example as taught in CN102063951, which is hereby incorporated by reference in its entirety. As discussed in CN102063951, a pattern of micro-channels can be formed in a substrate using an embossing technique. Embossing methods are generally known in the prior art and typically include coating a curable liquid, such as a polymer, onto a rigid substrate. A pattern of micro-channels is embossed (impressed) onto the polymer layer by a master having a reverse pattern of ridges formed on its surface. The polymer is then cured. A conductive ink is coated over the substrate and into the micro-channels, the excess conductive ink between micro-channels is removed, for example by mechanical buffing, patterned chemical electrolysis, or patterned chemical corrosion. The conductive ink in the micro-channels is cured, for example by heating. In an alternative method described in CN102063951, a photosensitive layer, chemical plating, or sputtering is used to pattern conductors, for example using patterned radiation exposure or physical masks. Unwanted material (e.g. photosensitive resist) is removed, followed by electro-deposition of metallic ions in a bath.

There is a need, however, for further improvements in conductivity and transparency for micro-wire transparent electrodes and the substrates in which they are formed.

SUMMARY OF THE INVENTION

In accordance with the present invention, a method of making a micro-channel structure and applying a curable ink to the micro-channel structure, comprising:

a) providing a substrate;

b) depositing a single layer of a curable polymer on the substrate, the single curable layer having a layer thickness;

c) embossing one or more micro-channels into the single curable layer, the micro-channels having a micro-channel thickness that is in a range of two microns to ten microns less than the layer thickness, and curing the single curable layer to form a single cured layer so that deformations of the micro-channels or the surface of the single cured layer are reduced, wherein the micro-channels are adapted to receive curable ink;

d) coating the curable ink over the surface and micro-channels of the single cured layer;

e) removing the curable ink from the surface of the single cured layer; and f) curing the curable ink.

The present invention provides a transparent electrode with improved transparency and conductivity with improved manufacturability. The transparent electrodes of the present invention are particularly useful in capacitive touch screen and display devices.

BRIEF DESCRIPTION OF THE DRAWINGS

The above and other features and advantages of the present invention will become more apparent when taken in conjunction with the following description and drawings wherein identical reference numerals have been used to designate identical features that are common to the figures, and wherein.

The Figures are not drawn to scale since the variation in size of various elements in the Figures is too great to permit depiction to scale.

DETAILED DESCRIPTION OF THE INVENTION

The present invention is directed toward electrically conductive micro-wires formed in micro-channel structures in a substrate with improved transparency. The micro-channel structures facilitate the distribution of a curable ink, for example a curable conductive ink that is electrically conductive when cured.

Figure 1:
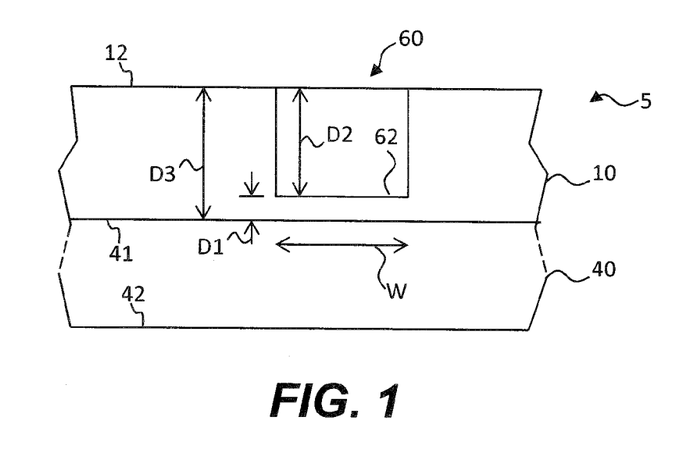
FIG. 1 is a cross section of an embodiment of the present invention.
Figure 2:
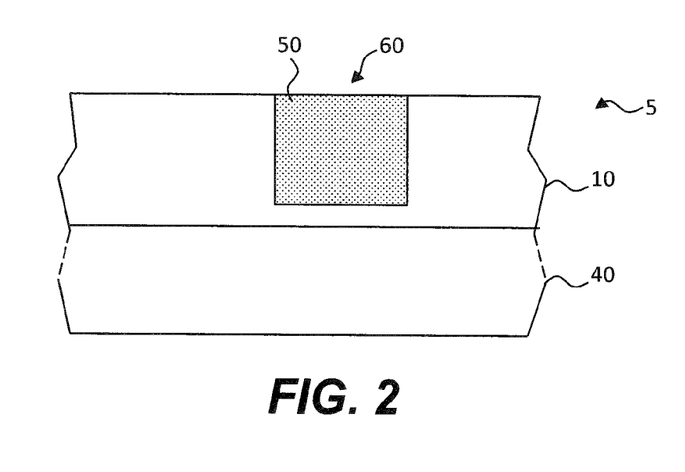
FIG. 2 is a cross section of an embodiment of the present invention including micro-wires.

Referring to FIG. 1 in an embodiment of the present invention, a micro-channel structure 5 includes a substrate 40 having a first surface 41 and an opposing second surface 42. A single cured layer 10 is formed on first surface 41 of substrate 40. Single cured layer 10 has one or more micro-channels 60, wherein the micro-channels 60 are adapted to receive curable ink embossed therein and a root mean square (RMS) surface roughness between or within micro-channels 60 of less than or equal to 0.2 microns. Micro-channel 60 extends from a single cured layer surface 12 of single cured layer 10 to a micro-channel bottom 62 of micro-channel 60. A single cured layer thickness D3 of single cured layer 10 is in a range of about two microns to ten microns greater than a micro-channel thickness D2 of micro-channel 60. A remaining thickness D1 between micro-channel bottom 62 of micro-channel 60 and first surface 41 of substrate 40 is therefore the difference between single cured layer thickness D3 and micro-channel thickness D2. Micro-channel 60 has a width W in a direction substantially parallel to single cured layer surface 12 and first surface 41 of substrate 40. Referring further to FIG. 2, cured ink, for example forming a micro-wire 50, is located in each micro-channel 60 formed in single cured layer 10 on substrate 40 to form micro-channel structure 5.

As used herein, a thickness is also considered to be a depth. Thus, micro-channel thickness D2 is also the depth of micro-channel 60. Single cured layer thickness D3 is also the depth of single cured layer 10 and remaining thickness D1 is the thickness of single cured layer 10 between micro-channel bottom 60 and first surface 41.

A cured layer is a layer of curable material that has been cured. For example, single cured layer 10 is formed of a curable material coated or otherwise deposited on first surface 41 of substrate 40 and then cured to form a cured layer. Once coated, the curable material is considered herein to be a curable layer. Likewise, micro-wire 50 is a cured ink. A curable ink is deposited or otherwise located within micro-channels 60 and then cured to form a cured ink, such as a micro-wire 50.

As used herein, single cured layer 10 is a layer that is embossed in a single step and cured in a single step. The embossing step and the curing step are generally different single steps. For example, the single curable layer 10 is embossed in a first step using a stamping method known in the art and cured in a second different step, e.g. by heat or exposure to radiation. In another embodiment, embossing and curing single cured layer 10 is done in a single common step. The single curable layer 10 is deposited as a single layer in a single step using coating methods known in the art, e.g. curtain coating. In an alternative embodiment, single curable layer 10 is deposited as multiple sub-layers in a single step, using multi-layer deposition methods known in the art, e.g. multi-layer slot coating, repeated curtain coatings, or multi-layer extrusion coating. In yet another embodiment, the single curable layer 10 includes multiple sub-layers formed in different, separate steps. For example, referring to FIG. 7, single cured layer 10 can include multiple sub-layers 70A, 70B, 70C deposited in the common step on substrate 40, for example with a multi-layer extrusion, curtain coating, or slot coating machine as is known in the coating arts. Micro-channel 60 is embossed and cured in multiple sub-layers 70A, 70B, 70C in a single step and micro-wires 50 are formed by depositing a curable conductive ink in the micro-channels 60 and curing the curable conductive ink to form an electrically conductive micro-wire 50.

Single cured layer 10 of the present invention can include a cured polymer material with cross-linking agents that are sensitive to heat or radiation, for example infra-red, visible light, or ultra-violet radiation. The polymer material can be a curable material applied in a liquid form that hardens when the cross-linking agents are activated. When a molding device, such as an embossing stamp having an inverse micro-channel structure is applied to liquid curable material coated on substrate 40 and the cross-linking agents in the curable material are activated, the liquid curable material is hardened into single cured layer 10 having micro-channels 60. The liquid curable materials can include a surfactant to assist in controlling coating on substrate 40. Materials, tools, and methods are known for embossing coated liquid curable materials to form single cured layers 10 having micro-channels 60.

Similarly, cured inks of the present invention are known and can include conductive inks including electrically conductive nano-particles, such as silver nano-particles. The electrically conductive nano-particles can be metallic or have an electrically conductive shell. The electrically conductive nano-particles can be silver, can be a silver alloy, or can include silver.

Curable inks provided in a liquid form are deposited or located in micro-channels 60 and cured, for example by heating or exposure to radiation such as infra-red, visible light, or ultra-violet radiation. The curable ink hardens to form the cured ink. For example a curable conductive ink with conductive nano-particles is located within micro-channels 60 and heated to agglomerate or sinter the nano-particles, thereby forming an electrically conductive micro-wire 50. Materials, tools, and methods are known for coating liquid curable inks to form micro-wires 50 in micro-channels 60.

As conventionally practiced, the embossing process moves curable material out of embossed structures in a curable layer. More material is relocated when embossing deeper or wider micro-channel structures. For relatively thick curable layers (e.g. greater than 20 microns or even greater than 12 microns), significant deformities can be avoided since the amount of material relocated compared to the total amount of material in a curable layer is small. However, it has been demonstrated that relatively thick conventional single curable layers 10 reduce transparency through absorption of visible light. Furthermore, over time, single curable layer 10 tends to become more yellow, further reducing transparency and providing an undesirable color. Thus, it is disadvantageous to employ thick single curable layers 10.

Figure 8:
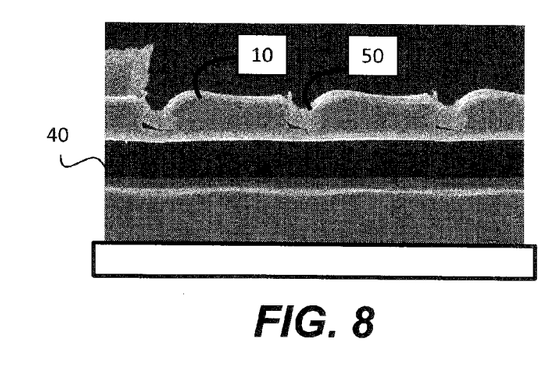
FIG. 8 is a micrograph cross section representation of a micro-channel structure illustrating deformities.
Figure 10:
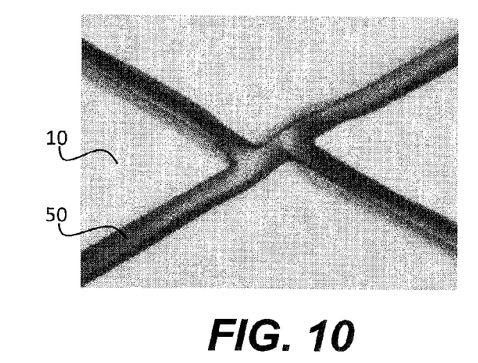
FIG. 10 is a micrograph perspective representation of a micro-channel structure illustrating deformities.

It has also been demonstrated that the process of embossing in a curable material layer in relatively thin layers causes distortions in single cured layer surface 12, especially in the area immediately adjacent to micro-channels 60 and within micro-channels 60, for example on the sides of micro-channel 60 or micro-channel bottom 62. These distortions cause surface deformities that reduce single curable layer 10 surface 12 flatness and render single cured layer 10 to be non-planar. In consequence, when a curable ink is coated over single cured layer 10, the deformities prevent proper filling of micro-channels 60. In a first case, no curable ink is located in micro-channel 60; in a second case, too little curable ink is located in micro-channel 60. In the first case, no micro-wire 50 is formed, in the second case micro-wire 50 is formed that has too little cured ink so that micro-wire 50 has reduced conductivity or does not form an electrically continuous conductor. FIG. 8 is a cross-section representation of micro-channels 60 and single cured layer 10 having such deformities together with badly formed micro-wires 50 formed on substrate 40. FIG. 10 is a perspective representation of badly formed micro-wires 50 in single cured layer 10 having such deformities together.

Figure 9:
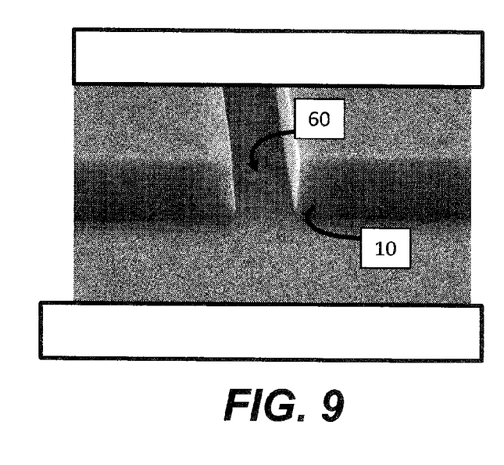
FIG. 9 is a micrograph perspective representation of a micro-channel structure according to an embodiment of the present invention.
Figure 11:
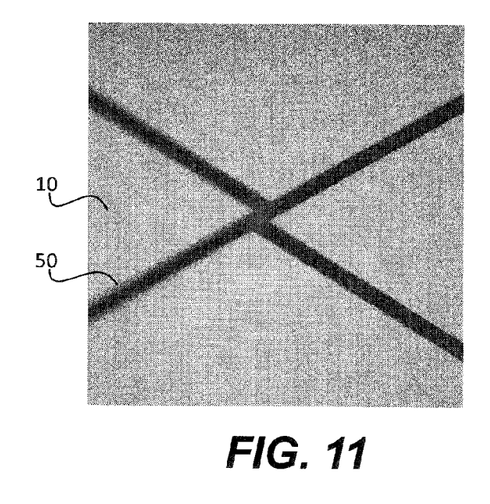
FIG. 11 is a micrograph perspective representation of a micro-channel structure according to an embodiment of the present invention.

Surprisingly, applicants have discovered a relationship between single cured layer thickness D3 and micro-channel thickness D2 that, when properly employed, reduces the formation of deformities in the single cured layer 10 and consequently facilitates the distribution of a curable ink to properly form micro-wires 50. The present invention provides an advantage in reducing surface irregularities and deformities in single cured layer 10 and micro-channels 60, thereby enabling the proper construction of micro-wires 50 in micro-channels 60. FIG. 9 is a perspective representation of micro-channels 60 and single cured layer 10 free of deformities formed by methods of the present invention. FIG. 11 is a perspective representation of micro-wires 50 in single cured layer 10 free of deformities formed by methods of the present invention.

The present invention further improves transparency by reducing single cured layer thickness D3 of single cured layer 10.

Thus, in embodiments of the present invention, single cured layer surface 12 of single cured layer 10 is substantially planar and has an RMS surface roughness of less than or equal to 0.1 microns or an RMS surface roughness of less than or equal to 0.05 microns. As is known in the art, no surface is perfectly smooth and thus two surfaces are never completely planar or parallel. As used herein, a substantially planar surface is a surface that is sufficiently planar to enable locating curable ink in micro-channels 60 that, when cured form micro-wires 50 that have an electrical conductivity and connectivity adequate to meet the needs of the device in which the micro-channel structure is incorporated.

Figure 3:
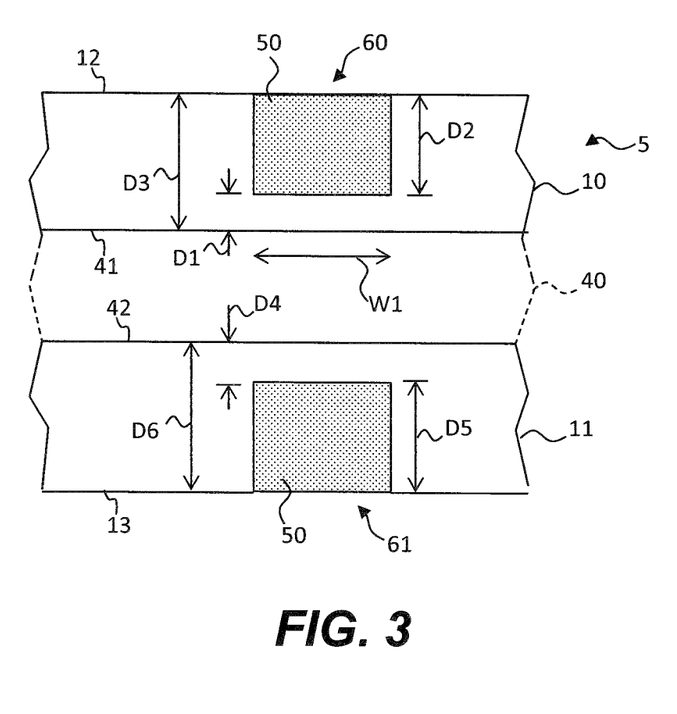
FIG. 3 is a cross section of an embodiment of the present invention having micro-channels on either side of a substrate.

In a further embodiment of the present invention, referring to FIG. 3, substrate 40 of micro-channel structure 5 has a first surface 41 opposite and substantially parallel to opposing second surface 42. Single cured layer 10 is on first surface 41 and has single cured layer thickness D3 extending from single cured layer surface 12 to first surface 41 of substrate 40. Micro-channels 60 have a micro-channel thickness D2 that is remaining thickness D1 less than single cured layer thickness of D3. A second single cured layer 11 is formed on opposing second surface 42 of substrate 40. Second single cured layer 11 includes one or more second micro-channels 61 formed therein and has an RMS surface roughness between or within second micro-channels 61 of less than or equal to 0.2 microns. Cured ink is located in each micro-channel 60 and second micro-channel 61 and can form electrically conductive and electrically connected micro-wires 50. A second single cured layer thickness D6 of second single cured layer 11 extending from second single cured layer surface 13 to opposing second surface 42 of substrate 40 is about two microns to ten microns greater than a second micro-channel thickness D5 of second micro-channel 61 so that second remaining thickness D4 is the difference between second single cured layer thickness D6 and second micro-channel thickness D5. Single cured layer thickness D3 is the same as second single cured layer thickness D6 and micro-channel thickness D2 is the same as micro-channel thickness D5. As shown in FIG. 3, both micro-channel 60 and second micro-channel 61 have a common width W1.

Figure 4:
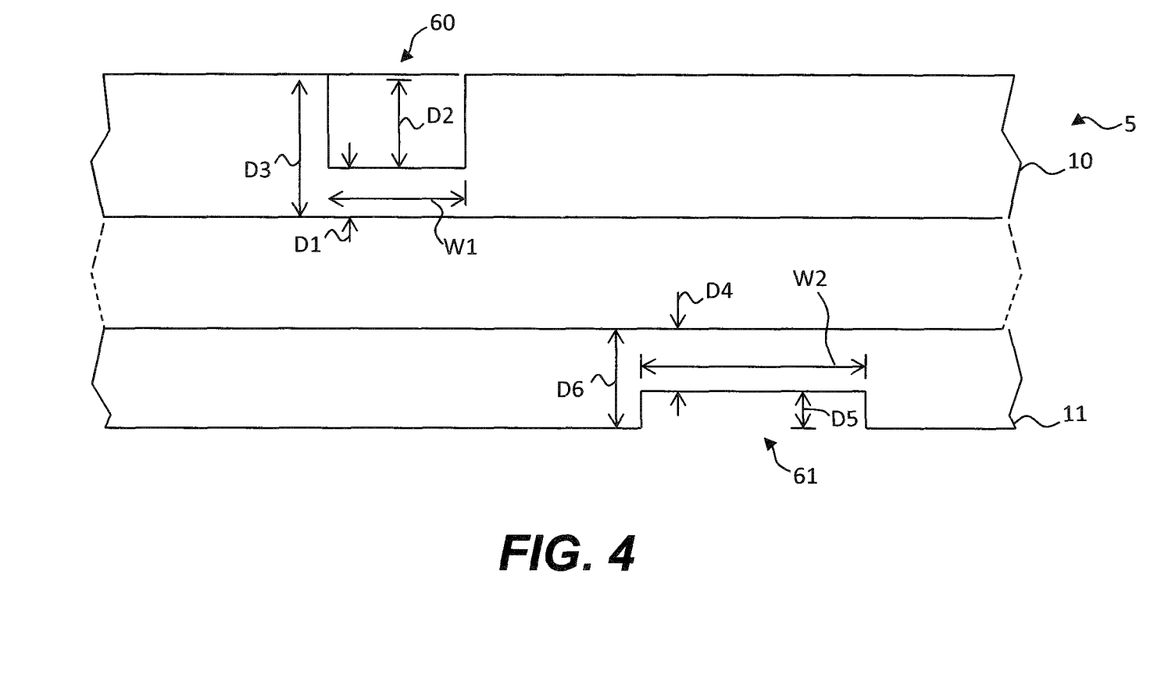
FIG. 4 is a cross section of an embodiment of the present invention having displaced micro-channels on either side of a substrate.

In an alternative embodiment of the present invention, single cured layer thickness D3 is different from second single cured layer thickness D6, or micro-channel thickness D2 is different from second micro-channel thickness D5, or both. Referring to FIG. 4, single cured layer 10 has a single cured layer thickness D3 that is different from second single cured layer thickness D6 of second single cured layer 11 and micro-channel thickness D2 of micro-channel 60 is different from second micro-channel thickness D5 of second micro-channel 61. Width W1 of micro-channel 60 is different from width W2 of second micro-channel 61 and remaining thickness D1 is different from second remaining thickness D4. Thus, referring to FIG. 5, micro-wires 50 are formed in micro-channels 60 and second micro-wires 51 are formed in second micro-channels 61 on either side of substrate 40 with different thicknesses, widths, or electrical conductivities.

In various embodiments of the present invention, single cured layer thickness D3 is in the range of about four microns to twelve microns, width W of micro-channel 60 is in the range of about two microns to twelve microns, micro-channel thickness D2 is in the range of about two microns to ten microns, single cured layer surface 12 has a water contact angle greater than 45 degrees, and the curable ink has a surface tension of greater than 50 dynes/cm which facilitates the locating curable ink in micro-channels 60.

Figure 6:
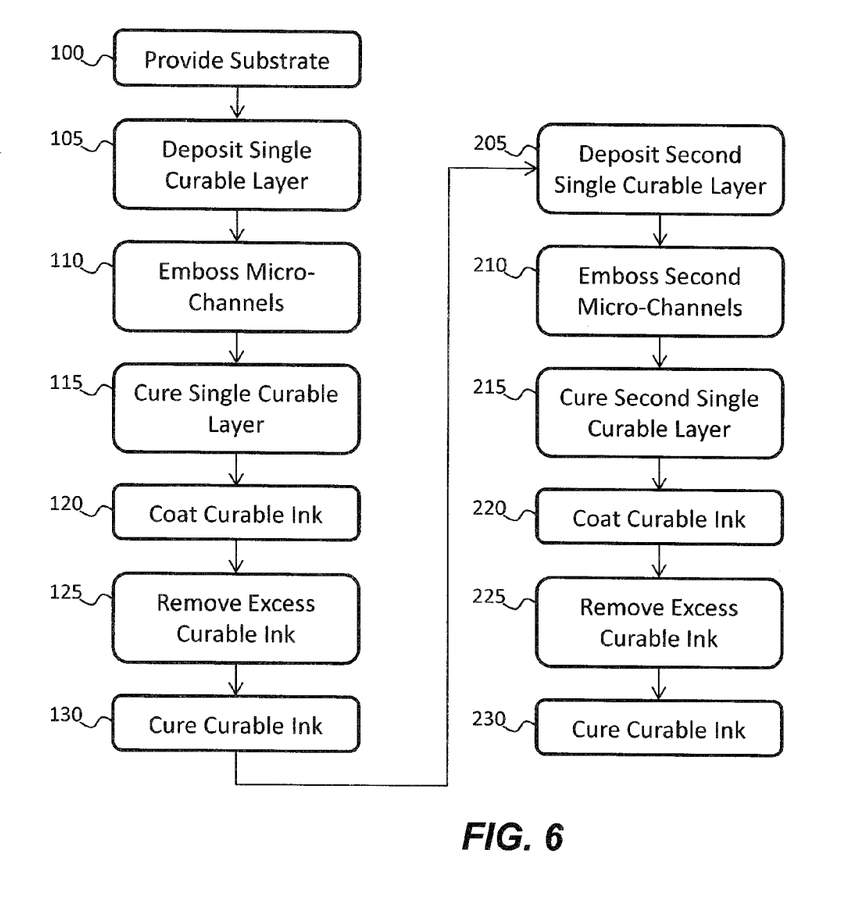
FIG. 6 is a flow diagram of a method according to an embodiment of the present invention.

Referring to FIG. 6 and to FIGS. 1 and 2, a method of making a micro-channel structure 5 and applying a curable ink to micro-channel structure 5 includes providing 100 a substrate 40, depositing 105 a single layer of a curable polymer on first surface 41 of substrate 40, the single curable layer 10 having a layer thickness or depth, e.g. D3. One or more micro-channels 60 are embossed 110 into the single curable layer 10, micro-channels 60 having a micro-channel thickness D2 that is in a range of two microns to ten microns less than the single curable layer thickness D3. The single curable layer 10 is cured 115 to form single cured layer 10 having a single cured layer thickness D3 so that deformities in micro-channels 60 or in single cured layer surface 12 are reduced.

Figure 5:
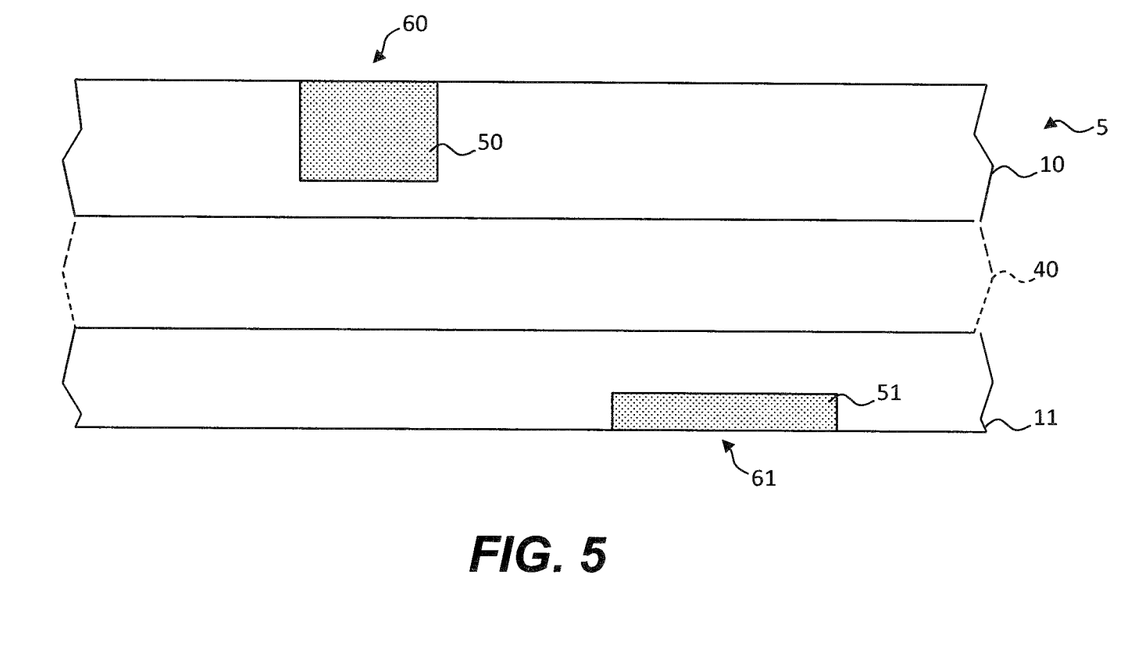
FIG. 5 is a cross section of an embodiment of the present invention having micro-wires on either side of a substrate.

Curable ink is coated 120 over single curable layer 10 surface 12 and micro-channels 60 of single cured layer 10 and excess curable ink removed 125 from single cured layer surface 12 so that curable ink is only located in the micro-channels 60. The curable ink is cured 130. In a further embodiment of the present invention, the cured ink forms electrically conductive micro-wires 50 in micro-channels 60. In a further embodiment of the present invention, referring to FIG. 3 and further to FIG. 6, a second single layer of a curable polymer is deposited 205 on opposing second surface 42 of substrate 40. Second micro-channels 61 are embossed into the second single curable layer 11. Second micro-channels 61 have a second micro-channel thickness D5 that is in a range of two microns to ten microns less than second curable layer thickness (e.g. D6). Second single curable layer 11 is cured 215 to form second micro-channels 61 in second single cured layer 11 having a second curable layer thickness D6 so that deformations of second micro-channels 61 or second single cured layer surface 13 of second single cured layer 11 are reduced. Curable ink is coated 220 over second single curable layer surface 13 and second micro-channels 61 of second single cured layer 11 and excess curable ink removed 225 from second single cured layer surface 13. The curable ink is cured 230. In a further embodiment of the present invention, the cured ink forms electrically conductive second micro-wires 51 in second micro-channels 61 (FIG. 5).

In an embodiment, steps 105 to 230 are done sequentially. In another embodiment, steps 110 and 115 are done simultaneously or in a single step and steps 210 and 215 are done simultaneously or in a single step.

According to various embodiments of the present invention, the curable ink includes electrically conductive nano-particles and curing steps 130 or 230 sinter or agglomerate the electrically conductive nano-particles to form micro-wires 50, 51. In other embodiments, the electrically conductive nano-particles are silver, a silver alloy, include silver, or have an electrically conductive shell.

In another embodiment, coating 120, 220 the curable ink includes coating the curable ink in a liquid state and curing 130, 230 the curable ink includes curing the curable ink into a solid state.

In embodiments of the present invention, deformations in micro-channels 60, on single cured layer surface 12 of single cured layer 10 are reduced, or at the corner of micro-channels 60 and single cured layer surface 12 of single cured layer 10.

Figure 7:
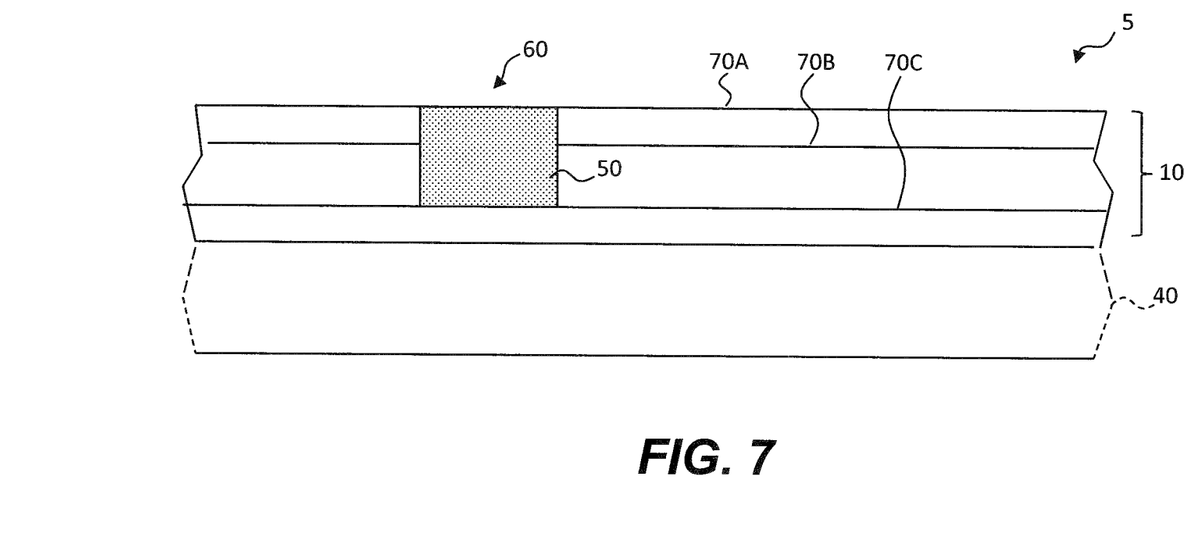
FIG. 7 is a cross section of a micro-channel structure with multiple sub-layers according to an embodiment of the present invention.

In yet another embodiment of the present invention, depositing 105 the single curable layer 10 includes depositing multiple sub-layers 70A, 70B, 70C in a common step and curing 115 multiple sub-layers 70A, 70B, 70C of single curable layer 10 in a single step.

In various embodiments of methods of the present invention, single cured layer thickness D3 is substantially equal to second single cured layer thickness D5, single cured layer thickness D3 is different from second single cured layer thickness D5, or single cured layer 10 is cured in a common step with second single cured layer 11.

In another embodiment of the present invention, a single curable layer 10 is deposited, embossed, or cured before a second single curable layer 11 is deposited, embossed, or cured.

In an embodiment, a micro-channel structure 5 is formed by steps 100 to 115 of FIG. 6. In yet another embodiment of the present invention, a micro-channel structure 5 is formed by steps 100 to 130 of FIG. 6. In an alternative embodiment, a micro-channel structure 5 is formed by steps 100 to 230 of FIG. 6.

According to various embodiments of the present invention, substrate 40 is any material having a first surface 41 on which a single cured layer 10 can be formed. Substrate 40 can be a rigid or a flexible substrate made of, for example, a glass, metal, plastic, or polymer material, can be transparent, and can have opposing substantially parallel and extensive surfaces. Substrates 40 can include a dielectric material useful for capacitive touch screens and can have a wide variety of thicknesses, for example 10 microns, 50 microns, 100 microns, 1 mm, or more. In various embodiments of the present invention, substrates 40 are provided as a separate structure or are coated on another underlying substrate, for example by coating a polymer substrate layer on an underlying glass substrate.

Substrate 40 can be an element of other devices, for example the cover or substrate of a display or a substrate, cover, or dielectric layer of a touch screen. According to embodiments of the present invention, micro-wires 50 extend across at least a portion of substrate 40 in a direction parallel to first surface 41 of substrate 40. In an embodiment, a substrate 40 of the present invention is large enough for a user to directly interact therewith, for example with an implement such as a stylus or with a finger or hand. Methods are known in the art for providing suitable surfaces on which to coat a single curable layer 10. In a useful embodiment, substrate 40 is substantially transparent, for example having a transparency of greater than 90%, 80% 70% or 50% in the visible range of electromagnetic radiation.

Electrically conductive micro-wires 50 and methods of the present invention are useful for making electrical conductors and busses for transparent micro-wire electrodes and electrical conductors in general, for example as used in electrical busses. A variety of micro-wire patterns can be used and the present invention is not limited to any one pattern. Micro-wires 50 can be spaced apart, form separate electrical conductors, or intersect to form a mesh electrical conductor on or in substrate 40. Micro-channels 60 can be identical or have different sizes, aspect ratios, or shapes. Similarly, micro-wires 50 can be identical or have different sizes, aspect ratios, or shapes. Micro-wires 50 can be straight or curved.

A micro-channel 60 is a groove, trench, or channel formed on or in substrate 40 extending from single cured layer surface 12 toward first surface 41 of substrate 40 and having a cross-sectional width W less than 20 microns, for example 10 microns, 5 microns, 4 microns, 3 microns, 2 microns, 1 micron, or 0.5 microns, or less. In an embodiment, micro-channel thickness D2 of micro-channel 60 is comparable to width W. Micro-channels 60 can have a rectangular cross section, as shown. Other cross-sectional shapes, for example trapezoids, are known and are included in the present invention. The width or depth of a layer is measured in cross section.

In various embodiments, cured inks can include metal particles, for example nano-particles. The metal particles can be sintered to form a metallic electrical conductor. The metal nano-particles can be silver or a silver alloy or other metals, such as tin, tantalum, titanium, gold, copper, or aluminum, or alloys thereof. Cured inks can include light-absorbing materials such as carbon black, a dye, or a pigment.

In an embodiment, a curable ink can include conductive nano-particles in a liquid carrier (for example an aqueous solution including surfactants that reduce flocculation of metal particles, humectants, thickeners, adhesives or other active chemicals). The liquid carrier can be located in micro-channels 60 and heated or dried to remove liquid carrier or treated with hydrochloric acid, leaving a porous assemblage of conductive particles that can be agglomerated or sintered to form a porous electrical conductor in a layer. Thus, in an embodiment, curable inks are processed to change their material compositions, for example conductive particles in a liquid carrier are not electrically conductive but after processing, form an assemblage that is electrically conductive.

Once deposited, the conductive inks are cured, for example by heating. The curing process drives out the liquid carrier and sinters the metal particles to form a metallic electrical conductor. Conductive inks are known in the art and are commercially available. In any of these cases, conductive inks or other conducting materials are conductive after they are cured and any needed processing completed. Deposited materials are not necessarily electrically conductive before patterning or before curing. As used herein, a conductive ink is a material that is electrically conductive after any final processing is completed and the conductive ink is not necessarily conductive at any other point in micro-wire 50 formation process.

In various embodiments of the present invention, micro-wire 50 has a width less than or equal to 10 microns, 5 microns, 4 microns, 3 microns, 2 microns, or 1 micron. In an example and non-limiting embodiment of the present invention, each micro-wire 50 is from 10 to 15 microns wide, from 5 to 10 microns wide, or from 5 microns to one micron wide. In some embodiments, micro-wire 50 can fill micro-channel 60; in other embodiments micro-wire 50 does not fill micro-channel 60. In an embodiment, micro-wire 50 is solid; in another embodiment micro-wire 50 is porous.

Micro-wires 50 can be metal, for example silver, gold, aluminum, nickel, tungsten, titanium, tin, or copper or various metal alloys including, for example silver, gold, aluminum, nickel, tungsten, titanium, tin, or copper. Micro-wires 50 can include a thin metal layer composed of highly conductive metals such as gold, silver, copper, or aluminum. Other conductive metals or materials can be used. Alternatively, micro-wires 50 can include cured or sintered metal particles such as nickel, tungsten, silver, gold, titanium, or tin or alloys such as nickel, tungsten, silver, gold, titanium, or tin. Conductive inks can be used to form micro-wires 50 with pattern-wise deposition or pattern-wise formation followed by curing steps. Other materials or methods for forming micro-wires 50, such as curable ink powders, including metallic nano-particles, can be employed and are included in the present invention.

Electrically conductive micro-wires 50 of the present invention are useful, for example in touch screens such as projected-capacitive touch screens that use transparent micro-wire electrodes and in displays. Electrically conductive micro-wires 50 can be located in areas other than display areas, for example in the perimeter of the display area of a touch screen, where the display area is the area through which a user views a display.

Methods and devices for forming and providing substrates and coating substrates are known in the photo-lithographic arts. Likewise, tools for laying out electrodes, conductive traces, and connectors are known in the electronics industry as are methods for manufacturing such electronic system elements. Hardware controllers for controlling touch screens and displays and software for managing display and touch screen systems are well known. These tools and methods can be usefully employed to design, implement, construct, and operate the present invention. Methods, tools, and devices for operating capacitive touch screens can be used with the present invention.

The present invention is useful in a wide variety of electronic devices. Such devices can include, for example, photovoltaic devices, OLED displays and lighting, LCD displays, plasma displays, inorganic LED displays and lighting, electrophoretic displays, electrowetting displays, dimming mirrors, smart windows, transparent radio antennae, transparent heaters and other touch screen devices such as resistive touch screen devices.

The invention has been described in detail with particular reference to certain embodiments thereof, but it will be understood that variations and modifications can be effected within the spirit and scope of the invention.

PARTS LIST

D depth
D1 remaining thickness
D2 micro-channel thickness
D3 single cured layer thickness
D4 second remaining thickness
D5 second micro-channel thickness
D6 second single cured layer thickness
W width
W1 width
W2 width
5 micro-channel structure
10 single cured/curable layer
11 second single cured layer
12 single cured layer surface
13 second single cured layer surface
40 substrate
41 first surface
42 opposing second surface
50 micro-wire
51 second micro-wire
60 micro-channel
61 second micro-channel
62 micro-channel bottom
70A multiple sub-layers
70B multiple sub-layers
70C multiple sub-layers
100 provide substrate step
105 deposit single curable layer step
110 emboss micro-channels step
115 cure single curable layer step
120 coat conductive ink step
125 remove excess conductive ink step
130 cure conductive ink step
205 deposit second single curable layer step
210 emboss second micro-channels step
215 cure second single curable layer step 220 coat conductive ink step
225 remove excess conductive ink step
230 cure conductive ink step

The invention claimed is:

1. A method of making a transparent micro-wire device including a cured ink located in a micro-channel structure, comprising:
   a) providing a substrate having a transparency of greater than 50%, wherein the substrate has a first side opposite and substantially parallel to a second side;
   b) depositing a first single layer of a curable polymer on the first side of the substrate, the first single curable layer having a surface and a first layer thickness;
   c) embossing one or more first micro-channels into the first single curable layer, the first micro-channels having a first micro-channel thickness that is in a range of two microns to ten microns less than the layer thickness, and curing the first single curable layer to form a first single cured layer having a thickness that is in a range of about four microns to about twelve microns so that deformations of the first micro-channels or the surface of the first single cured layer are reduced;
   d) coating a curable ink over the surface and first micro-channels of the first single cured layer;
   e) removing the curable ink from the surface of the first single cured layer;
   f) curing the curable ink in the first micro-channels;
   g) depositing a second single layer of the curable polymer on the second side of the substrate, the second single curable layer having a surface and a second layer thickness;
   h) embossing one or more second micro-channels into the second single curable layer, the second micro-channels having a second micro-channel thickness that is in a range of two microns to ten microns less than the second single curable layer thickness, and curing the second single curable layer to form a second single cured layer so that deformations of the second micro-channels or the surface of the second single cured layer are reduced;
   i) coating the curable ink over the surface and second micro-channels of the second single cured layer;
   j) removing the curable ink from the surface of the second single cured layer; and
   k) curing the curable ink in the second micro-channels to provide a transparent micro-wire device.

2. The method of claim 1, wherein the curable ink includes electrically conductive nano-particles.

3. The method of claim 2, further including sintering the electrically conductive nano-particles.

4. The method of claim 2, wherein the electrically conductive nano-particles are silver, a silver alloy, include silver, or have an electrically conductive shell.

5. The method of claim 2, wherein the steps of curing the curable ink forms an electrically conductive micro-wire in each first and second micro-channel.

6. The method of claim 1, wherein the curable ink is coated in a liquid state and cured into a solid state.

7. The method of claim 1, wherein the curable ink has a surface tension of greater than 50 dynes/cm.

8. The method of claim 1, wherein the surface of the first or second single cured layer has a water contact angle greater than 45 degrees.

9. The method of claim 1, wherein the reduced deformations are in the first or second micro-channels or on the surface of the respective first or second single curable layer.

10. The method of claim 1, wherein the reduced deformations are at the corner of the first or second micro-channels and the surface of the respective first or second single cured layer.

11. The method of claim 1, wherein the first or second single cured layer has multiple sub-layers.

12. The method of claim 1, wherein the thickness of the first or second micro-channel is in the range of about ten microns to two microns.

13. The method of claim 1, wherein the width of the first or second micro-channel is in the range of about twelve microns to two microns.

14. The method of claim 1, wherein the surface of the first or second single cured layer is substantially planar.

15. The method of claim 1, wherein the thickness of the first single cured layer is substantially equal to the thickness of the second single cured layer.

16. The method of claim 1, wherein the thickness of the first single cured layer is different from the thickness of the second single cured layer.

17. The method of claim 1, wherein the first single curable layer is cured in a common step with the second single curable layer.

18. The method of claim 1, wherein the first single curable layer is cured before the second single curable layer.

* * * * *